United States Patent [19]

Maeda

[11] Patent Number: 4,870,646
[45] Date of Patent: Sep. 26, 1989

[54] WORD SYNCHRONIZER

[75] Inventor: Shigeki Maeda, Tokyo, Japan

[73] Assignee: NEC Corporation, Tokyo, Japan

[21] Appl. No.: 106,292

[22] Filed: Oct. 9, 1987

[30] Foreign Application Priority Data

Oct. 9, 1986 [JP] Japan .................................. 61-240714

[51] Int. Cl.⁴ ......................... G06F 11/10; H04L 7/00
[52] U.S. Cl. .......................................... 371/42; 371/46
[58] Field of Search ......................... 371/37, 42, 47, 46

[56] References Cited

U.S. PATENT DOCUMENTS

| | | | |
|---|---|---|---|
| 3,668,632 | 6/1972 | Oldham, III | 371/42 |
| 3,961,311 | 6/1976 | Pavoni et al. | 371/42 |
| 4,404,676 | 9/1983 | DeBenedictis | 371/47 |
| 4,481,648 | 11/1984 | Fujii | 375/119 |
| 4,747,105 | 5/1988 | Wilson et al. | 371/47 |

*Primary Examiner*—Charles E. Atkinson
*Attorney, Agent, or Firm*—Sughrue, Mion, Zinn, Macpeak, and Seas

[57] ABSTRACT

For establishing word synchronization between a data bit stream of N-bit words and the timing of syndrome calculation, a count value is incremented in response to the bit timing of the words and generating a hunting pulse for every count of N bits and a load timing pulse at every count of C bits. Syndrome calculation is performed on the N-bit words in response to the hunting pulse to derive a syndrome when each of the N-bit words is out of synchronization with the timing of the calculation. The syndrome is latched for a word interval and a first enabling signal is generated in response to the latching of the syndrome. Syndrome generating words are counted to generate a second enabling signal when the count provides a valid indication that the word timing of the calculation is out of sync with the data bit stream. A copy of the hunting pulse is generated and delayed for a period of M bits when the first and second enabling signals are simultaneously present to cause syndrome calculation to be performed on the N-bit words, where the N and M integers are relatively prime and the integer C is smaller than integer M and greater than unity. The point of initialization is shifted for each syndrome calculation from one bit to another in search of the beginning of a word. Because of the "relatively prime" relationship of the integers N and M, all the bits of incoming data bit stream are examined in the search.

3 Claims, 3 Drawing Sheets

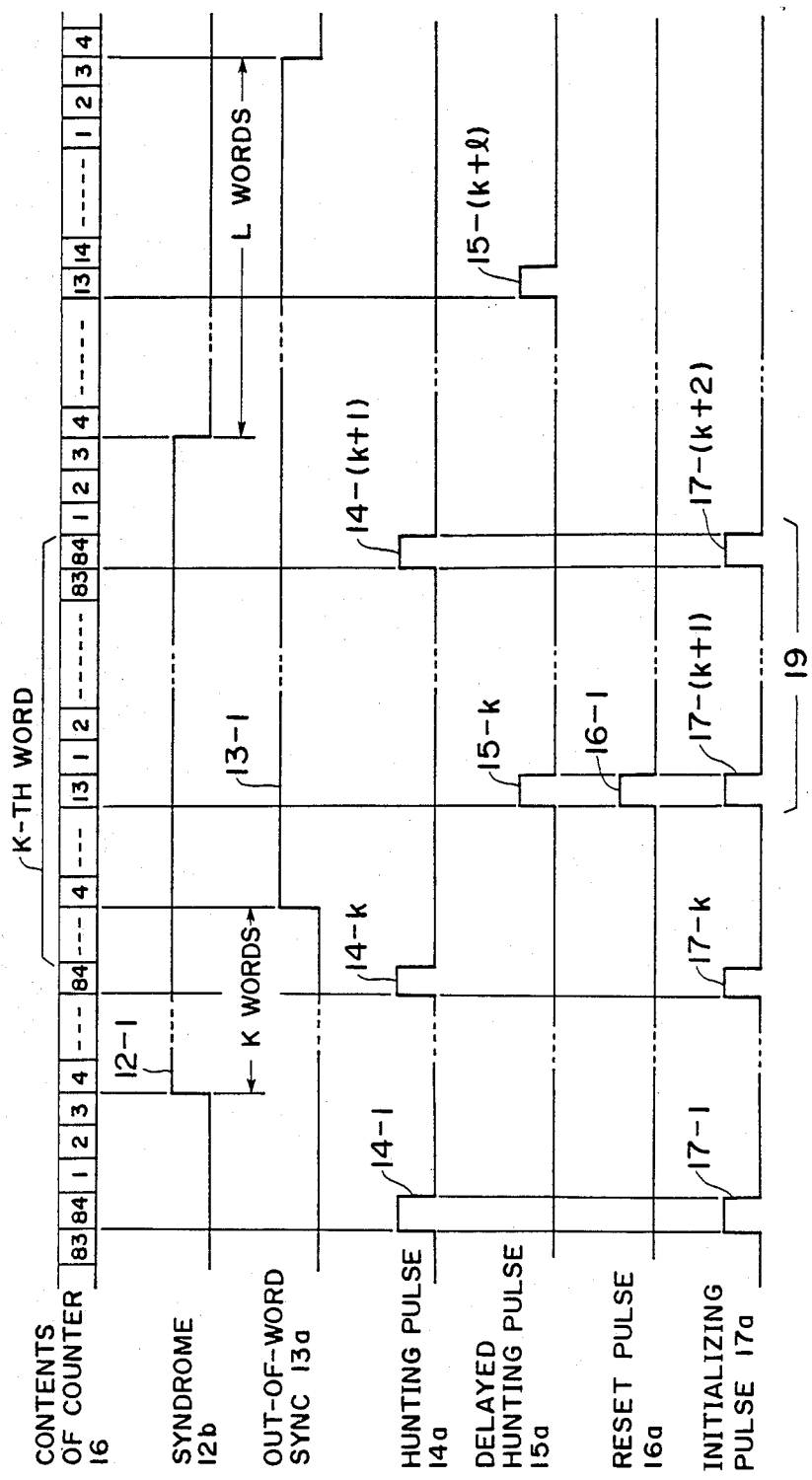

WORD SYNCHRONIZER

BACKGROUND OF THE INVENTION

The present invention relates to a word synchronizer for synchronizing a syndrome calculator to the word timing of a data bit stream.

A known word synchronizer comprises a syndrome calculator and a single-stage shift register. The syndrome calculator is initialized at every N bits of an incoming N-bit word in the absence of a syndrome and additionally initialized at 1 bit interval delayed after the every N-bit initialization in the presence of a syndrome in search of the beginning of a valid data word. However, the word synchronizer is allowed a short interval of time to extract a syndrome from the syndrome calculator and store it for a subsequent word interval. Therefore, it must be constructed of components capable of operating at high speeds.

SUMMARY OF THE INVENTION

Accordingly, it is an object of the present invention to provide word synchronization which eases speed requirements imposed on circuit implementation.

This object is obtained by initializing a syndrome calculator at every N bits of an N-bit word in the absence of a syndrome and initializing it at every N bits and at M-bit interval delayed after the every N-bit initialization in the presence of a syndrome, wherein the integers N and M are relatively prime to each other.

According to one aspect of the present invention, there is provided a method for establishing synchronism between a data bit stream of N-bit words which are encoded with an error correcting code and the timing of syndrome calculation. According to this method, a count value is incremented in response to the bit timing of the words and generating a hunting pulse for every count of N bits and a load timing pulse at every count of C bits. Syndrome calculation is performed on the N-bit words in response to the hunting pulse to derive a syndrome when each of the N-bit words is out of synchronization with the timing of the calculation. The syndrome is stored in response to the load timing pulse and a first enabling signal is generated in response to the storage of the syndrome. Words which generate the syndrome are counted to generate a second enabling signal when the count provides a valid indication that the data bit stream is out of sync with the timing of the syndrome calculation. A copy of the hunting pulse is generated and delayed for a period of M bits. When the first and second enabling signals are simultaneously present, syndrome calculation is performed on the N-bit words in response to the delayed copy, wherein the integer C is greater than unity but smaller than the integer M.

Since there is an allowance of M bits within which the syndrome can be extracted and stored, components for implementing a word synchronizer are not required to operate at high speeds. The point of initialization is shifted for each syndrome calculation from one bit to another in search of the beginning of a word. Because of the N and M integers being in a "relatively prime" relationship, all the bits of incoming data bit stream are examined in the search.

According to a specific aspect of the invention, there is provided a word synchronizer adapted to receive a data bit stream of N-bit words which has been encoded by an error correcting code. The word synchronizer comprises a first resettable timing circuit for incrementing a count in response to the bit timing of the words and generating a hunting pulse for every count of N bits. A shift register having M stages generates a copy of the hunting pulse and delaying it for a period of M bits. A gate circuit generates an output in response to the delayed copy when enabled by first and second enabling signals. A syndrome calculator is arranged to be initialized in response to the hunting pulse and the output of the gate circuit for performing calculation on the N-bit words and deriving a syndrome when each of the N-bit words is out of synchronization with the timing of the calculation. A second resettable timing circuit is initialized in response to the hunting pulse and the output of the gate circuit for incrementing a count in response to the bit timing of the words and generating a load timing pulse at a count of C bits from the initialization. A syndrome latch is enabled in response to the load timing pulse for storing the syndrome and supplying an output as said first enabling signal to the gate circuit. A word sync detector counts the number of words generating the syndrome and supplies an output as said second enabling signal to the gate circuit when the count provides a valid indication that the data bit stream is out of sync with the timing of the syndrome calculator.

BRIEF DESCRIPTION OF THE DRAWINGS

The present invention will be described in further detail with reference to the accompanying drawings, in which:

FIG. 3 is a timing diagram useful for an understanding of the invention.

DETAILED DESCRIPTION

Figure 1:
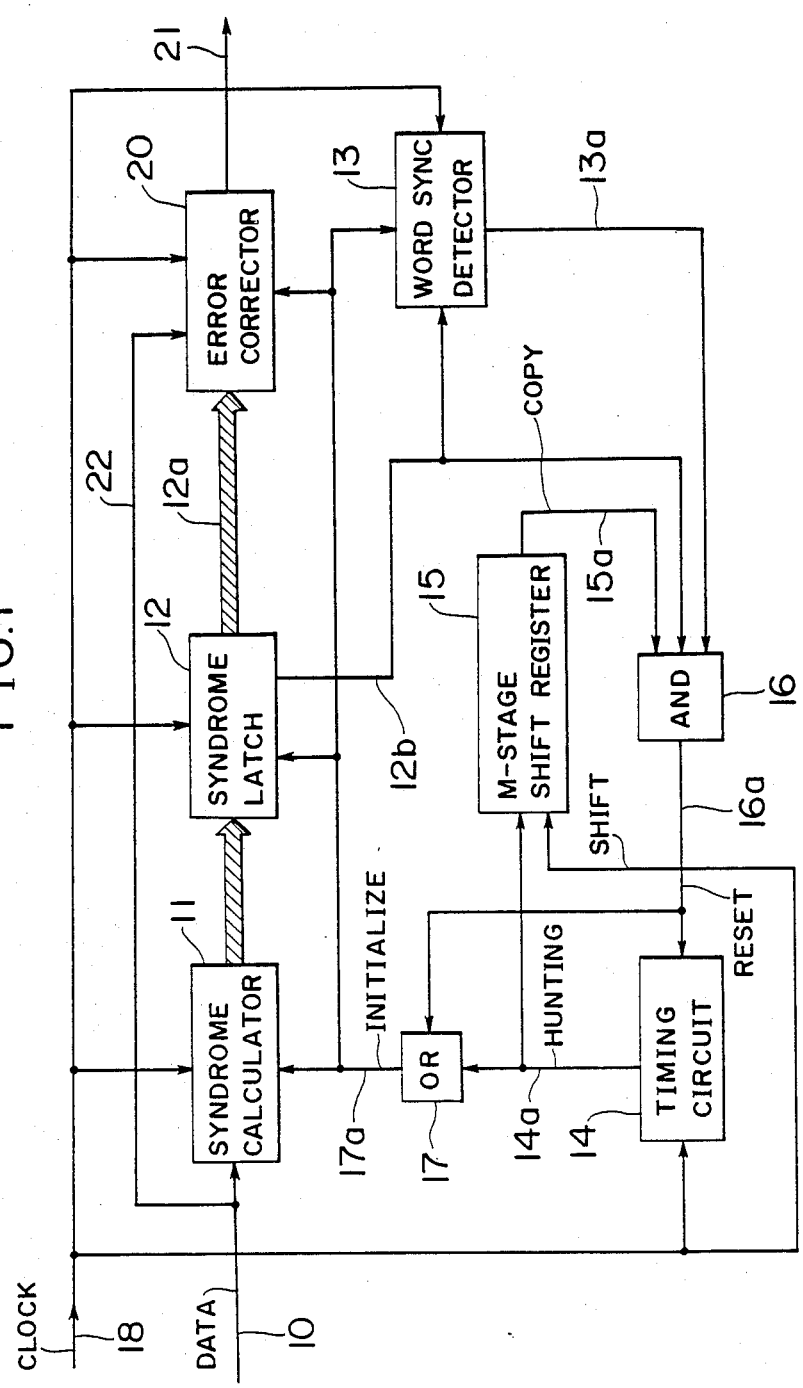
FIG. 1 is a block diagram of a word synchronizer according to the present invention.

A word synchronizer of the present invention, as represented in FIG. 1, is connected to a demodulator, not shown, to receive through input line 10 a series of N-bit words which have been encoded with an error correcting code and apply it to a syndrome calculator 11 of a known design. When an error is detected in the received data bit stream or when the word timing of the syndrome calculator 11 is out of word sync with the input bit stream, syndrome calculator 11 generates a parallel output which is latched into a syndrome latch 12. The output of the word synchronizer is taken from the syndrome latch 12 through an output bus 12a to an error corrector 20 which corrects error bits in the incoming data bit stream supplied on line 22 with the syndrome and supplies error-corrected data bit stream to an output line 21.

During the presence of a syndrome, syndrome latch 12 further generates a syndrome presence signal on line 12b to a word synchronization detector 13 and an AND gate 16 to which the output of word sync detector 13 is also applied. A clock input, which is synchronized with the bit timing of the data bit stream, is also supplied from the demodulator through an input terminal 18 to syndrome calculator 11, syndrome latch 12 and word sync detector 13. A timing circuit 14 is provided to count the clock input and supply a hunting pulse 14a for every N bits to the data input of an M-stage shift register 15. Shift register 15 produces a copy of the hunting pulse 14a and generates an output when that copy has shifted along its M-stages in response to the clock input and supplies it to AND gate 16 as a delayed hunting pulse 15a to allow the syndrome calculator 11 to perform syndrome calculation in search of the beginning of a data word.

The hunting pulse 14a from timing circuit 14 is also applied to an OR gate 17 to which the output of AND gate 16 is also applied. OR gate 17 supplies its output as an initializing pulse 17a to the reset inputs of syndrome calculator 11, syndrome latch 12 and word sync detector 13.

Figure 2:
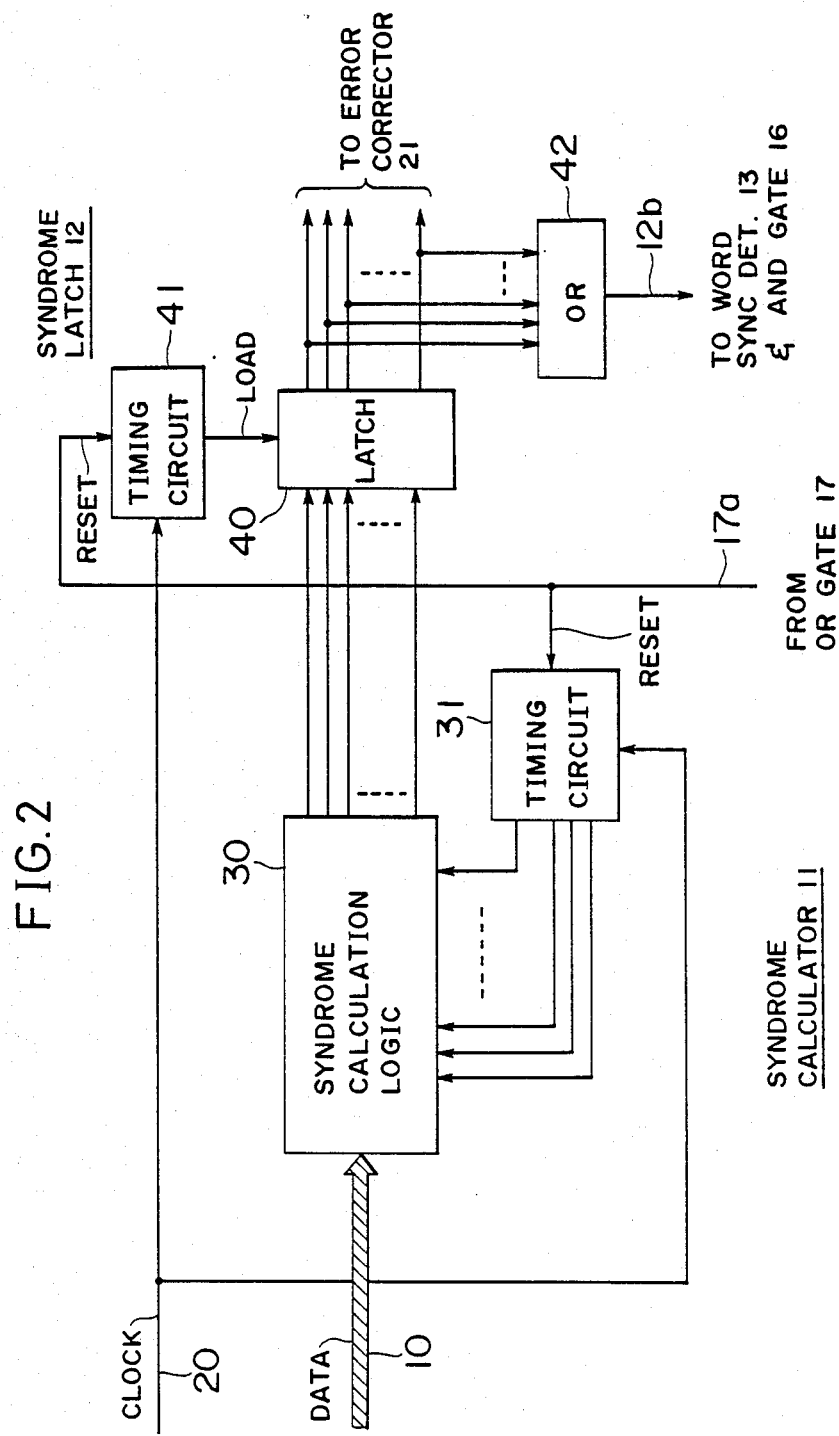
FIG. 2 is a circuit diagram illustrating the details of the syndrome calculator and syndrome latch of FIG. 1.

As shown in FIG. 2, syndrome calculator 11 comprises a syndrome calculation logic 30 and a timing circuit 31 which counts the clock input in response to the initializing pulse 17a and supplies appropriately delayed reset pulses to various stages of the calculation logic.

Syndrome latch 12 is constructed of a latch 40, a timing circuit 41 and an OR gate 42. Timing circuit 41 is reset by the initializing pulse 17a to count the clock input and supply a load timing pulse to a load enable input of the latch 40 when the count attains a value C which is appropriately determined anywhere between unity and the integer M of the M-stage shift register 15. A syndrome generated in the syndrome calculation logic 30 is latched into the latch 40 in response to the load timing pulse and stored therein until it is reset by the initializing pulse 17a. Thus, the syndrome is stored in the latch 40 for a period equal to the length of a data word. The outputs of latch 40 are connected to OR gate 42 to produce a logical-one output whenever a syndrome is generated.

The logical-one output of OR gate 42 is applied as a syndrome presence signal 12b to the word sync detector 13 and AND gate 16. Word sync detector 13 generates a logical-one output as an indication of out-of-word sync condition when it counts syndrome-generating K words before it counts L words that generate no syndrome and generates a logical-zero output as an indication of in-word-sync condition when it counts L words that generate no syndrome before it counts syndrome-generating K words.

As will be described, the integer N of the word length and the integer M of the shift register stages are "relatively prime" to each other; namely, the integers N and M have no common divisor except for unity. If the input data word is of 84-bit length including error control redundant bits, one suitable value for the integer M is 13.

The operation of the circuit of FIG. 1 will now be described with reference to FIG. 3. Assume that the input data word is 84-bit long and the shift register 15 has 13 stages. In addition, the timing circuit 42 of syndrome latch 12 enables the latch 40 at the count of 4 bits from the receipt of an initializing pulse 17a from OR gate 17. It is assumed that the word synchronizer is initially word-synchronized so that outputs 12b and 13a are initially low, but for some reasons timing slips have occurred between the word timing of the incoming data and the word timing of the syndrome calculator, resulting in the generation of a syndrome in the syndrome calculator 11.

A hunting pulse 14-1 is generated at the count of 84 clock pulses by the timing circuit 14 regardless of whether it coincides with the end of an incoming word or not. Hunting pulse 14-1 is applied to the 13-stage shift register 15 and further applied through OR gate 17 as an initializing pulse 17-1 to the syndrome calculator 11 and syndrome latch 12.

The syndrome generated in the syndrome calculator 11 is latched into the syndrome latch 12 at the fourth bit from the receipt of the initializing pulse 17-1. Therefore, a syndrome presence signal 12-1 is applied to the word sync detector 13 and AND gate 16. If the syndrome continues for a period greater than the length of K input data words, the word sync detector 13 generates a logical-one output (out-of-word sync) 13-1 at the fourth bit of the K-th word. During this K-word interval, hunting pulses 14-2 to 14-k and initializing pulses 17-2 to 17-k are generated, with the resultant generation of delayed hunting pulses 15-1 through 15-k. Since the AND gate 16 is enabled by the logical-one outputs of syndrome latch 12 and word sync detector 13, the hunting pulse 15-k is passed through the AND gate and applied as a reset pulse 16-1 to timing circuit 14 and OR gate 17, producing an initializing pulse 17-(k+1). Therefore, at the 13th of the K-th word, the timing circuit 14 is reset and the syndrome calculator 11 and syndrome latch 12 are initialized. At the end of the K-th word, the timing circuit 14 generates a hunting pulse 14-(k+1), causing the OR gate 17 to supply an initializing pulse 17-(k+2).

If this out-of-word sync condition persists, a delayed hunting pulse 15-(k+1), not shown, will be generated at the 13-th bit of the (K+1)-th word in response to the hunting pulse 14-(k+1) in a manner similar to the pulse event that occurred at the 13-th bit of the K-th word. Therefore, pulse events marked 19 in FIG. 3 will be recyclically generated as long as the out-of-word sync condition continues. At every 13-th bit, syndrome calculator 11 treats the first bit of an incoming data bit stream as if it were the beginning of a valid data word. Since the integers 84 and 13 are relatively prime as discussed earlier, the time at which the syndrome calculator 11 is initialized is shifted from one bit to another upon calculation of a string of data bits for the length of a word so that the word synchronizer hunts for all the bits of N-bit words in search of their word timing as long as the out-of-word sync condition exists.

Assume that the syndrome no longer exists during the (K+1)-th word, no syndrome will be detected by syndrome latch 12 at the 4-th bit of the (K+1)-th word, and the word sync detector 13 starts counting L words that generate no syndromes and switches its output to logic-zero at the 4-th bit of the (K+L)-th word.

It follows from the foregoing that since the shift register 15 produces a hunt timing pulse 15a at the count of the 13-th bit from the time of initialization, there is a sufficient margin for the syndrome calculator 11 to transfer its output to latch 12 and for the syndrome latch 12 to extract, the output of syndrome calculator 11. In the illustrated embodiment, the syndrome latch 12 is allowed to extract the syndrome within the period of 13 bits as compared to the prior art word synchronizer in which the period of only one bit is allowed to extract a syndrome. This relaxes the operating requirements of the syndrome calculator and syndrome latch and allows a greater freedom of choice for selecting a desired error correcting code.

The foregoing description shows only a preferred embodiment of the present invention. Various modifications are apparent to those skilled in the art without departing from the scope of the present invention which is only limited by the appended claims. For example, the number of stages of the shift register 15 may be set equal to a value greater than the integer N.

What is claimed is:

1. A method for establishing synchronism between a data bit stream of N-bit words encoded with an error correcting code and the timing of syndrome calculation, comprising the steps of:

(a) incrementing a count in response to each bit of said N-bit words and generating a hunting pulse for every count of N bits and a load timing pulse at every count of C bits, where the integer C is greater than unity;
   (b) performing the syndrome calculation on said N-bit words in response to said hunting pulse and deriving therefrom a syndrome;
   (c) storing said syndrome and generating a first enabling signal in response to said load timing pulse;
   (d) counting words which generate said syndrome and generating a second enabling signal when the count indicates an out-of-word synchronization; and
   (e) delaying said hunting pulse for a period of M bits when said first and second enabling signals are simultaneously present and causing the step (b) to additionally perform said calculation in response to said delayed hunting pulse, wherein the integer M is larger than the integer C and the integers M and N are relatively prime to each other.

2. A word synchronizer adapted to receive a data bit stream of N-bit words encoded with an error correcting code, comprising:

counter means for counting each bit of said N-bit words and generating a hunting pulse for every count of N bits and a load timing pulse for every count of C bits, the integer C being greater than unity;
   syndrome calculator means for performing syndrome calculation on said N-bit words in response to said hunting pulse and deriving therefrom a syndrome;
   syndrome latch means for storing said syndrome and generating a first enabling signal in response to said load timing pulse;
   word synchronization detector means connected to said syndrome latch means for counting words which generate said syndrome and generating a second enabling signal when the count indicates an out-of-word synchronization; and
   shift register means having M stages for delaying said hunting pulse for a period of M bits when said first and second enabling signals are simultaneously present and causing said syndrome calculator means to additionally perform said calculation in response to said delayed hunting pulse, wherein the integer M is larger than the integer C and the integers M and N are relatively prime to each other.

3. A word synchronizer adapted to receive a data bit stream of N-bit words encoded with an error correcting code, comprising:

first resettable counter means for counting each bit of said N-bit words and generating a hunting pulse for every count of N bits;
   shift register means having M stages for generating a copy of said hunting pulse and delaying the copy for a period of M bits, wherein the integers N and M are relatively prime to each other;
   gate means for generating an output in response to said delayed copy when enabled by first and second enabling signals applied thereto;
   resettable syndrome calculator means arranged to be initialized in response to said hunting pulse and said output of the gate means for performing calculation on said N-bit words and deriving therefrom a syndrome;
   second resettable counter means arranged to be initialized in response to said hunting pulse and said output of the gate means for counting each bit of said N-bit words and generating a load timing pulse at every count of C bits, wherein the integer C is greater than unity and smaller than the integer M;
   syndrome latch means for storing said syndrome and supplying a signal as said first enabling signal to said gate means in response to said load timing pulse; and
   word synchronization detector means connected to said syndrome latch means for counting words generating said syndrome and supplying a signal as said second enabling signal to said gate means when the count indicates that the input data bit stream is out of word synchronization with the timing of said syndrome calculator means.

* * * * *